United States Patent [19]
Volkert et al.
[11] 3,787,211
[45] Jan. 22, 1974

[54] MAKEREADY FOIL FOR RELIEF PRINTING

[75] Inventors: Otto Volkert, Ludwigshafen; Gerd Schrodt; Manfred Zuerger, both of Mannheim, all of Germany

[73] Assignee: Badische Anilin- & Soda-Fabrik Aktiengesellschaft, Ludwigshafen, Germany

[22] Filed: Dec. 10, 1971

[21] Appl. No.: 206,660

[52] U.S. Cl. ................. 96/35.1, 96/84 R, 96/115 P
[51] Int. Cl. ............................ G03c 1/84, G03c 1/70
[58] Field of Search .................... 96/35.1, 84, 115 P

[56] References Cited

UNITED STATES PATENTS

| | | | |
|---|---|---|---|
| 3,144,331 | 8/1964 | Thommes | 96/27 |
| 3,342,593 | 9/1967 | Burg | 96/35.1 |
| 3,674,494 | 7/1972 | Hoffmann et al. | 96/35.1 |

FOREIGN PATENTS OR APPLICATIONS

| | | | |
|---|---|---|---|
| 2,031,476 | 1/1971 | Germany | 96/35.1 |

*Primary Examiner*—Ronald H. Smith
*Attorney, Agent, or Firm*—Johnston, Root, O'Keeffe, Keil, Thompson & Shurtleff

[57] ABSTRACT

The invention relates to a process for the manufacture of a makeready foil for relief printing. A multilayer sheet consisting of a dimensionally stable base which transmits acting light; a non-photopolymerizable intermediate layer which is soluble in solvents and absorbs actinic light; and a photopolymerizable layer which contains a compound capable of absorbing actinic light, is exposed through a negative from the base side and the unexposed portions of the photopolymerizable layer and of the intermediate layer are washed out with a solvent from the photopolymerizable-layer side.

The makeready foil of the invention greatly simplifies the makeready process for the printer.

10 Claims, 2 Drawing Figures

MAKEREADY FOIL FOR RELIEF PRINTING

Figure 2:
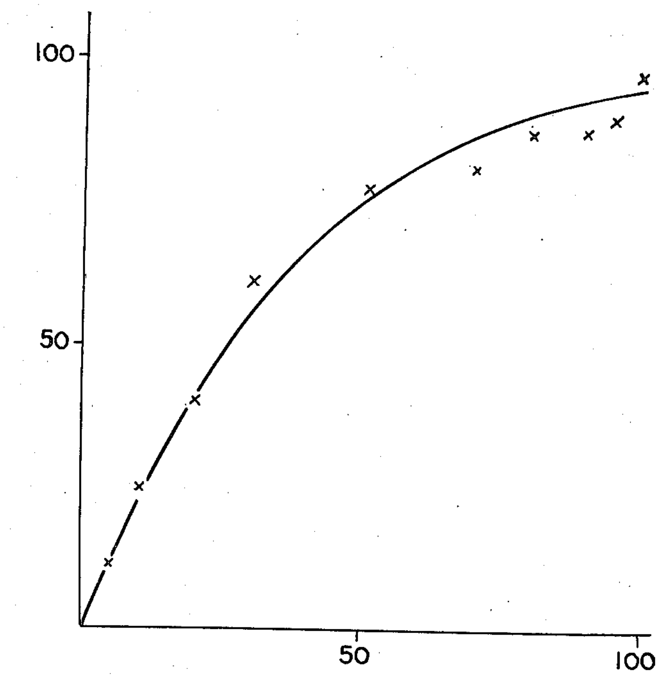

The invention relates to a makeready foil for relief printing. In relief printing, to obtain good printed copies, particularly in the case of pictures, more pressure must be applied to the solid areas and the deeper shadow areas than to the lighter tone areas. This is achieved by using a makeready material which is placed under the printing plate or in the packing. Like the printing plate itself, the makeready has a relief image. Unlike the printing plate, however, the height of the relief image on the makeready depends on the tonal values of the image to be printed. It is greatest for solid areas, generally between 100 and 150 $\mu$, and is virtually zero for very light tones.

In the prior art processes most commonly employed, the varying heights of the relief image on the makeready are produced by different methods, for example by a swelling process (3M system), by the application of a powder ("Primaton" system) or an etching process (MKZ system). In all of these processes, the makeready must first be printed in the printing press to provide it with a print of the image to be printed. The printed makeready material is then further treated according to the system used.

Attempts have also been made to produce the makeready for relief printing by photomechanical means: the relief image is obtained by exposing a special kind of photographic film through the base and then developing the film. In this method, an ordinary photographic film is required in addition to the said special film. In the photomechanical production of makeready, it is necessary to pull two proofs from the form on the press. Owing to the fact that the said special film is extremely difficult to manufacture, it is not possible to use such photomechanical makeready methods in the printing industry.

It is an object of the invention to simplify the comparatively complicated and troublesome makeready methods. A further object of the invention is to manufacture a makeready foil without there being any need to pull makeready proofs on the press. It is yet another object of the invention to produce the variations in height of the relief image on the makeready foil as a function of the tonal values of the negative. The makeready foil of the invention improves the standardization and reproducibility of the makeready process.

These objects are achieved by a process for the manufacture of a makeready foil for relief printing, wherein the photopolymerizable layer of a multilayer sheet is exposed through a negative from the base side of the said multilayer sheet and the unexposed portions of the photopolymerizable layer and those portions of the intermediate layer which are immediately beneath said unexposed portions are washed out with a solvent from the photopolymerizable-layer side.

The multilayer sheet is composed of a. a dimensionally stable base which transmits actinic light;

b. a non-photopolymerizable intermediate layer having a thickness of from 5 to 60 $\mu$ which is soluble in developer solutions and contains from 0.01 to 10 percent by weight of compounds which are capable of absorbing actinic light; and c. a photopolymerizable layer which is from 20 to 250 $\mu$ thick and contains from 0.01 to 10 percent by weight of compounds which are capable of absorbing actinic light.

The makeready foil of the invention is composed of a plurality of layers. The base consists of a plastics sheet which transmits actinic light and has a thickness of from 20 to 150 $\mu$. Moreover, this base must be dimensionally stable, i.e. it must be able to withstand the mechanical stresses occurring during printing. Base materials which satisfy these requirements are, for example, polyester sheets, polyvinyl chloride sheets and cellulose acetate sheets. We prefer to use sheets of polyethylene terephthalate 150 a thickness of from 20 to 150$\mu$.

There is applied to the base a layer referred to as the intermediate layer which is of a material which is not photopolymerizable but which is soluble in the solvents used for washing out the unexposed portions of the photopolymerizable layer. The intermediate layer advantageously has a thickness of from 5 to 60 $\mu$.

In the simplest case, the intermediate layer has the same composition as the photopolymerizable layer but no photoinitiator and, if desired, no monomers.

It has proved to be particularly advantageous when the intermediate layer has approximately the same optical density as the photopolymerizable layer. This is achieved by adding the same percentage amount of compounds which absorb actinic light to the intermediate layer and to the photopolymerizable layer, namely from 0.01 to 10 percent by weight.

The photopolymerizable layer has a basic composition such as is described for example in U.S. Pat. No. 2,760,863 or U.K. Pat. No. 1,173,043.

It consists of a polymeric base material, monomers containing olefinically unsaturated double bonds, photoinitiators and small amounts of thermal polymerization inhibitors.

Specific examples of polymeric base materials are vinyl polymers, such as polyvinyl chloride, vinylidene chloride polymers, copolymers of vinyl chloride and vinyl esters of monocarboxylic acids having from two to 11 carbon atoms and optionally vinyl alcohol, polymers of major amounts of olefinically unsaturated carboxylic acids having from three to five carbon atoms and/or their esters and/or amides, e.g., acrylic acid, methacrylic acid and their esters with alkanols of from one to 12 carbon atoms, such as acrylamide or methacrylamide. Also suitable are polymers based on styrene or vinyl esters of monocarboxylic acids having from two to 11 carbon atoms, such as vinyl acetate and vinyl chloroacetate. Other suitable polymers are those based on methacrylates and acrylates of aliphatic diols and polyols, such as ethylene glycol, 1,4-butanediol and glycerol. Finally, soluble cellulose derivatives, polyesters and polyethers may also be used.

Particularly suitable polymers are linear synthetic polyamides which contain recurring amide groups in the main chain of the molecule and which are soluble in conventional organic, especially alcoholic, solvents (as developer solutions). Of these, copolyamides are preferred which are soluble in conventional solvents or solvent mixtures, such as lower aliphatic alcohols, alcohol/water mixtures or mixtures of alcohols with other solvents such as benezene/alcohol/water mixtures, or which are soluble in ketones, esters or aromatic hydrocarbons. Examples of such copolyamides are those which have been prepared in a conventional manner by polycondensation or polymerization, e.g. activated anionic polymerization, of two or more lactams containing from five to 13 ring members. Examples of such lactams are pyrrolidone, caprolactam, enantholactam, caprylIactam, laurolactam or corresponding C-substituted lactams such as C-methyl-ϵ-caprolactam, ϵ-ethyl-ϵ-caprolactam and δ-ethylenantholactam. Instead of the lactams themselves, the aminocarboxylic acids on which they are based may be polycondensed. Other suitable copolyamides are polycondensation products of salts of the diamine/dicarboxylic acid type, prepared from at least three polyamide-forming starting materials. Preferred suitable dicarboxylic acids and diamines for this purpose are aliphatic dicarboxylic acids having from four to 20 carbon atoms, such as adipic acid, suberic acid, sebacic acid, dodecanedicarboxylic acid and corresponding substitution products such as α,α-diethyladipic acid, α-ethylsuberic acid, heptadecanedicarboxylic acid- (1,8) or heptadecanedicarboxylic acid-(1,9) or mixtures thereof, and dicarboxylic acids containing aliphatic or aromatic ring systems. Particularly suitable diamines are aliphatic or cycloaliphatic diamines having two primary and/or secondary amino groups, particularly those having from four to 20 carbon atoms, such as pentamethylene diamine, hexamethylene diamine, heptamethylene diamine, octamethylene diamine or C- and/or N-substituted derivatives or such amines, for example N-methyl-N'-ethylhexamethylene diamine, 1,6-diamino-4-methylhexane, 4,4'-diaminodicyclohexylmethane and 2,2-(4,4'-diaminodicyclohexyl)-propane, as well as aromatic diamines such as m-phenylene diamine, m-xylylene diamine and 4,4'-diaminodiphenylmethane. In all of the above starting materials, the bridging groups between the two carboxylic acid groups or amino groups may be optionally interrupted by heteroatoms such oxygen, nitrogen or sulfur atoms. Particularly suitable copolyamides are those which have been prepared by cocondensation of a mixture of one or more lactams, in particular caprolactam, and at least one salt of a dicarboxylic acid and a diamine, for example ϵ-caprolactam, hexamethylenediammonium adipate and 4,4'-diaminodicyclohexylmethane adipate.

Suitable monomers are compounds which contain photopolymerizable olefinically unsaturated double bonds and which are compatible to the extent of at least 20 to 50 percent by weight with the polymers which are included in the acid-(bulk of the monomers used, preferably from 70 to 100 percent by weight of the total amount of monomers used, should contain more than one photopolymerizable olefinic double bond. Very suitable monomers having at least two polymerizable olefinic double bonds and which are particularly suitable for mixing with soluble linear polyamides are those which contain, in addition to their double bonds, amide groups such as amides derived from acrylic acid and/or methacrylic acid. Specific examples are alkylene-bis-(meth)acrylamides, such as methylene-bis-acrylamide and methylene-bis-methacrylamide, the bis-acrylamides and bis-methacrylamides of aliphatic, cycloaliphatic and aromatic diamines or polyamines of from two to 12 carbon atoms, for example of ethylene diamine, propylene diamine, butylene diamine, pentamethylene diamine, hexamethylene diamine, heptamethylene diamine, octamethylene diamine, xylylene diamine, as well as polyamines and other diamines which may, if desired, be branched or interrupted by heteroatoms such as oxygen, nitrogen or sulfur atoms. Highly suitable are diethers of 1 mole of an aliphatic diol and 2 moles of N-methylol(meth) acrylamide. Photopolymerizable monomers which are also very suitable are those which contain, optionally in addition to amide groups, urethane groups or urea groups, such as the reaction products of mono(meth)acrylates of aliphatic diols with diisocyanates or the corresponding reaction products of mono(meth)acrylamides of diamines with diisocyanates. Further examples of suitable nitrogen-containing monomers are triacryloyl perhydrotriazine and triallyl cyanurate. Also suitable are the diacrylates, triacrylates and tetraacrylates and the dimethacrylates, trimethacrylates and tetramethacrylates of dihydric or polyhydric alcohols and phenols, e.g. di- and triethylene gylcol di(meth)acrylates. However, the use of difunctional or polyfunctional polymerizable monomers is not limited to the selection given above. It also includes other monomers having at least two polymerizable double bonds provided that these are compatible to the extent of at least 20 to 50 percent with the said copolyamides, which can be readily determined by simple experiment.

In addition to the monomers having more than one polymerizable olefinic double bond, minor amounts, preferably amounts of less than 30 percent by weight of the total amount of monomers, of monomers having only one polymerizable olefinic double bond may be used, examples being aromatic hydrocarbons, e.g., styrene and vinyl toluene, acrylamides or methacrylamides and their substitution products, e.g. N-methylol(meth)acrylamide, or their ethers or esters or monoesters of olefinically unsaturated carboxylic acids having from three to five carbon atoms and aliphatic diols or polyols, e.g. mono(meth)acrylates of ethylene glycol, diethylene glycol, triethylene glycol, glycerol, 1,1,1-trimethylolpropane and 1,4-butanediol. Their choice is governed by the above stipulations and the use to which the photosensitive mixtures are to be put.

Very suitable photopolymerizable mixtures contain, in substantially homogeneous admixture with each other, from 10 to 50 percent, particularly from 20 to 40 percent, by weight of monomers and from 90 to 50 percent, particularly from 80 to 60 percent, by weight of solid soluble polymers such as soluble polyamides. Preferred mixtures are solid and remain non-tacky even when heated to elevated temperatures, for example to 50° to 60°C.

Particularly suitable photoinitiators are compounds which decompose with the formation of free radicals under the action of light or radiation and thus initiate polymerization of the monomers. Examples are vicinal ketaldonyl compounds such as diacetyl, benzil, α-ketaldonyl alcohols such as benzoin, acyloin ethers such as benzoin methyl ether and benzoin isopropyl ether, α-substituted aromatic acyloins such as α-methylbenzoin. The photoinitiators are used in the usual amounts, advantageously in amounts from 0.01 to 10 percent, preferably from 0.01 to 3 percent, by weight based on the photocrosslinkable material. A detailed list and description of the photoinitiators and photocrosslinkable materials which can be used is given by J. Kosar, "Light-sensitive Systems," John Wiley & Sons, New York, 1965.

Suitable polymerization inhibitors are those which are usually used to prevent a thermal polymerization, e.g. hydroquinone, p- methoxyphenol, p-quinone, methylene blue, $\beta$-naphthol, phenols or salts of N-nitrosocyclohexylhydroxylamine. These inhibitors are generally used in amounts of from 0.01 to 2.0 percent, preferably in amounts of from 0.05 to 0.5 percent, by weight based on the photocrosslinkable material.

The thickness of the photopolymerizable layer is advantageously from 20 to 250 $\mu$, preferably from 40 to 150 $\mu$. The addition of compounds which absorb actinic light, i.e. compounds which absorb light particularly in the ultraviolet region of the spectrum, gives the photopolymerizable layer the optimum optical density. These compounds are used in amounts of from 0.01 to 10 percent by weight, based on the weight of the photopolymerizable layer.

It may be advantageous to provide the plastics sheet serving as base with an adhesive to improve its adhesion to the layer applied thereto. Suitable adhesives are electrostatically pretreated polyethylene sheets or adhesives based on polyesters or polyurethanes.

The makeready foil for use in relief printing is prepared by exposing the photopolymerizable layer of the multilayer sheet composed of the three layers (a), (b) and (c) through a negative from the base side of the said multilayer sheet and then washing out the unexposed portions of the photopolymerizable layer and those portions of the intermediate layer which are directly beneath said portions with a solvent from the photopolymerizable-layer side.

In an advantageous embodiment, the photopolymerizable layer is exposed, for example, through a half-tone negative from the base side of the multilayer sheet.

Subsequent washout with a solvent from the photopolymerizable-layer side produces a relief, the variations in height of which are substantially proportional to the optical density of the negative.

For example, a photopolymerizable layer having a thickness of from 20 to 250 $\mu$ is composed of from 50 to 90 percent by weight of a copolyamide based on a mixture of hexamethylenediamine adipate, 4,4'- diaminodicyclohexylmethane adipate and $\epsilon$-caprolactam, from 10 to 50 percent by weight of one or more photocrosslinkable acrylic acid derivatives such as N-methylolacrylamide, m-xylylene-bis-acrylamide, triethylene glycol diacrylate or the diether of ethylene glycol and N-methylolacrylamide, from 0.5 to 5 percent by weight of a photoinitiator such as $\alpha$-methylolbenzoin methyl ether and benzoin isopropyl ether, and from 0.1 to 1 percent by weight of a thermal polymerization inhibitor such as sodium N-nitrosocyclohexylhydroxylamine and p-methoxyphenol, and optional additions of ethylene glycol or plasticizers for example.

To achieve the optimum optical density, the photopolymerizable layer contains a compound having an absorbing action in the region of actinic light which, of course, should be photochemically and chemically inactive and should not interfere with the photopolymerization reaction.

Exposure is generally carried out with broad sources of light. Suitable light sources are conventional lamps emitting a high proportion of actinic light, for example mercury vapor lamps, xenon lamps and fluorescent tubes. By actinic light we mean ultraviolet light in the wavelength range 300 to 400 $\mu$.

In order to obtain the variations in height of the relief image as a function of the tonal values of the negative, it is necessary that the light rays scatter once they have passed through the half-tone negative. This is achieved by the use of broad light sources, but the effect is heightened by arranging the negative at a certain distance from the photopolymerizable layer during exposure. Constant spacing is achieved by exposing from the base side of the foil because the base then acts as a spacer between the negative and the photopolymerizable layer.

In order to obtain the variations in height of the relief image as a function of the tonal values of the negative, the photopolymerizable layer must also have a sufficiently high optical density for the actinic radiation. With a high optical density it is possible to produce a steep gradient of light intensity within the photopolymerizable layer. Reproducible photocrosslinking and consequently the varying heights of the relief image of the makeready foil are dependent on this sharp drop in intensity of the actinic light within the photopolymerizable layer.

The higher the optical density of the layer, the better the reproducibility and the smaller the average deviation in relief height. On the other hand, when optical densities are too high, exposure times are required which are not tolerable in practice. One is therefore forced to make a compromise.

The most favorable optical densities are obtained by adding compounds which absorb light particularly in the ultraviolet region of the spectrum and thus render the radiation in this range photochemically inactive.

A large number of conventional UV absorbers for plastics are suitable for this purpose, for example those described by R. A. Coleman, J. A. Weichsel, Modern Plastics, Vol. 36, No. 12, pages 117–121 and 198–200 (1959) and H. Gysling and H. J. Heller, Kunststoffe, 51, 13 to 17 (1961). Exanples of suitable compounds are o-hydroxybenzophenones or bisphenols which are substituted in the position adjacent to the hydroxy groups, such as 2,2'-dihydroxy-4-methoxybenzophenone and bis(2-hydroxy-3-tert-butyl-5-methylphenyl) methane. Very suitable are dinitro and trinitro compounds such as 2,4-dinitrophenol and organic-solvent-soluble metal complex dyes and phthalocyanine dyes which are generally referred to in the Color Index as "solvent dyes". The metal complex dyes are preferably 1:1 or 1:2 complexes of azo or azomethine dyes having o-carboxy-o'-hydroxy or o-amino-o'-hydroxy groups, particularly o,o'-dihydroxy groups. Particularly suitable metals are chromium and cobalt. Suitable dyes are described in British Pat. Nos. 944,409 and 981,050. Preferred phthalocyanines are copper-containing compounds. Particularly suitable dyes are disclosed in U.S. Pat. application Ser. No. 6301.

Alternatively, inorganic UV-absorbing pigments such as iron oxide, chromium oxide and titanium dioxide may be used.

The amount of UV-absorbing compound added depends on its absorptivity, the thickness of the layer and the tonal values requiring improvement by the makeready. In general, the amount used is from 0.01 to 10 percent by weight, based on the weight of the layer. We prefer to add from 0.1 to 1 percent by weight. When the layer has a thickness of 100 $\mu$ and its optical density is between 1 and 2, the exposure time using, for example, fluorescent tubes is between 2 and 5 minutes.

A prerequisite for a high-quality print is that the light areas of a picture having tonal values from zero to about 30 percent are not affected by the makeready. This means that during exposure the light passing through the negative which has an intensity corresponding to the tonal values between 0 and approximately 30 percent must not initiate photopolymerization, i.e., the formation of a relief, in the photopolymerizable layer. This requirement can be met by the use of the non-photopolymerizable intermediate layer.

The non-photopolymerizable intermediate layer has a thickness of from 5 to 60 μ and approximately the same optical density as the photopolymerizable layer. The light intensities corresponding to the tonal values zero to approximately 30 percent are therefore absorbed in the intermediate layer and thus cannot initiate any crosslinking reaction in the photopolymerizable layer.

To achieve exact reproducibility of the variations in height of the relief image as a function of the optical density of the negative, it is advantageous to adhere to the optimum distance between the negative and the photopolymerizable layer.

In the simplest case, the intermediate layer has the same composition as the photopolymerizable layer but no photoinitiator. If desired, monomers contained in the photopolymer layer may be omitted from the intermediate layer. The preferred thickness of the intermediate layer is from 15 to 30 μ. The thickness of the intermediate layer depends on the tones which it is desired to improve by the makeready.

Substantially the same optical properties are achieved in the intermediate layer as in the photopolymerizable layer by adding the same percentage amount of UV-absorbing compound to each layer.

The intermediate layer may have the following composition for example: a copolyamide based on approximately equal parts of hexamethylenediamine adipate, 4,4′-diaminodicyclohexylmethane adipate and ε-caprolactam which contains 2,4-dinitrophenol or Zapon fast black and to which, if desired, the diether of ethylene glycol and methylolacrylamide, N-methlolacrylamide, ethylene glycol or sodium N-nitrosocyclohexylhydroxylamine may be added.

The advantage of the intermediate layer and the photopolymer layer having substantially the same composition is that both layers can be washed out with the same solvent when the relief image is developed.

After exposure, the unexposed portions of the photopolymerizable layer are washed out with a solvent. Suitable solvents are, for example, lower aliphatic alcohols and preferably mixtures of ethanol and water in a ratio of about 4:1.

The intermediate layer is dissolved out at those areas where no photopolymerization has taken place in the photopolymerizable layer, i.e., at those areas corresponding to the light tones which do not require improvement by the makeready. However, at those areas where photopolymerization has taken place in the photopolymerizable layer the soluble intermediate layer is protected from the developer solution by the photopolymerized material of the top layer.

Excellent printed copies are obtained with the aid of the makeready foil of the invention. The makeready process is greatly simplified and thus saves a considerable amount of time. The printer now has at his disposal a makeready foil having a relief image, the variations in height of which are proportional to the optical density of the negative; the production of such makeready foils does not require the pulling of makeready proofs on the press. The makeready foil of the invention, starting from a negative, also makes time-consuming corrections by hand which are difficult to carry out unnecessary and improves standardization of the printing process.

Figure 1:
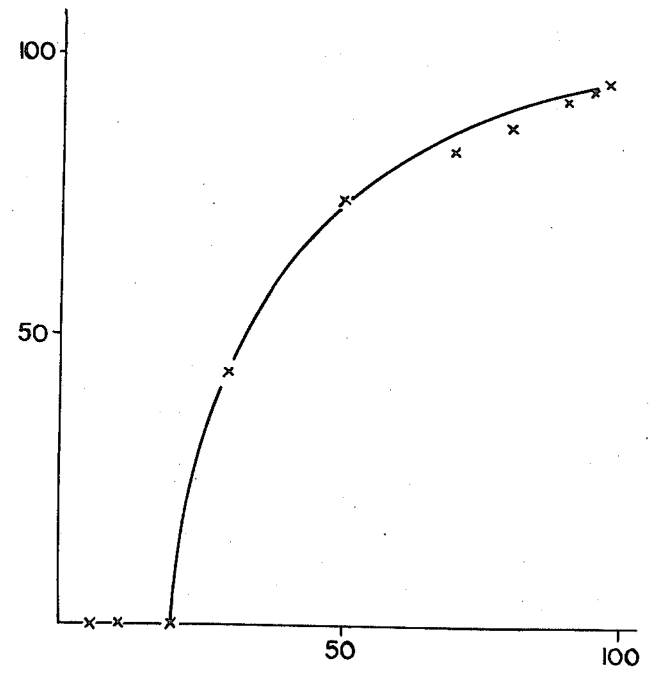

FIG. 1 is a graph showing the relationship between tonal value and relief height. In the case exemplified, the tonal values up to 20 percent require no makeready.

If desired, the makeready foil of the invention may be made without the intermediate layer. However, although the variations in height of the relief are still proportional to the optical density of the negative, it may be necessary to correct the makeready foil for the light tones, as shown in FIG. 2 and explained in Example 3.

EXAMPLE 1

To a polyester film having a thickness of 125 μ there is applied a 25 μ thick coating having the following composition:

89 parts of a copolyamide of approximately equal parts of hexamethylenediamine adipate, 4,4′-diaminodicyclohexylmethane adipate and ε-caprolactam, 27 parts of the diether of 1 mole of ethylene glycol and 2 moles of N-methylolacrylamide, 0.2 part of the sodium salt of N-nitrosocyclohexylhydrocylamine and 0.35 part of Zapon fast black RE, which is the 1:2 chromium mixed complex of the azo dyes obtained from the components 4-nitro-2-aminophenol, 5-nitro-2-aminophenol and β-naphthol. This layer is then coated with an 80 μ thick layer having the same composition but with the addition of 2 parts of α-methylol benzoin methyl ether. The resulting laminate is exposed through a half-tone step wedge from the base side for a period of 2 minutes. Exposure is carried out in a vacuum printing frame to ensure intimate contact between the base film and the negative. The light source used is a bank of fluorescent tubes emitting a high proportion of UV light and located at a distance of 3 cm from the negative. The non-polymerized portions are then washed out from the photopolymer-layer side using a 4:1 mixture of ethanol and water as solvent. After exposure and development, the variations in height of the relief image are substantially proportional to the tonal values of the negative, as shown in FIG. 1. A sample of this laminate is tested under actual operating conditions as a makeready foil and gives excellent results.

EXAMPLE 2

Two coatings are applied to a 75 μ thick base film of polyester as follows:

The first coating (intermediate layer) is 25 μ thick and consists of 100 parts of the copolyamide described in Example 1, 0.2 part of the sodium salt of N-nitrosocyclohexylhydroxylamine and 0.2 part of 2,4-dinitrophenol. The second coating is a 75 μ thick photopolymerizable layer consisting of 100 parts of the copolyamide described in Example 1, 8 parts of triethylene glycol bisacrylamide, 20 parts of m-xylylene-bisacrylamide, 30 parts of N-methylolacryloamide, 0.1 part of the sodium salt of N-nitrosocyclohexylhydroxylamine, 0.3 part of 2,4-dinitrophenol and 2 parts of α-methylol benzoin methyl ether. Exposure and development are carried out as described in Example 1. The relationship between the relief height and the tonal value of the negative is similar to that shown in FIG. 1. A printing test carried out with this makeready foil also gives excellent results.

EXAMPLE 3

There is applied to a 125 μ thick polyester film a 100 μ thick photopolymerizable coating of the following composition:

64 part of the copolyamide described in Example 1, 27 parts of the diether of ethylene glycol and N-methylolacrylamide, 2 parts of α-methylol benzoin methyl ether, 8 parts of ethylene glycol, 0.2 part of the sodium salt of N-nitrosocyclohexylhydroxylamine and 0.3 part of Zapon fast black RE. The resulting laminate is exposed as described in Example 1 for 2 minutes through a half-tone step wedge and then washed out from the photopolymer-layer side. There is obtained a relief image, the variations in height of which are proportional to the tonal values of the negative (FIG. 2). A printing test carried out with this makeready foil gives satisfactory results. However, the light tones of the print (tonal values from 0 to 20 percent) are somewhat too dark.

We claim:

1. A process for the manufacture of a makeready foil for relief printing having variations in height of the relief image as a function of the tonal values of a negative, wherein a multilayer sheet comprising a. a dimensionally stable and actinic light transmitting plastic base having a thickness of from 20 to 150 μ;

b. a non-photpolymerizable intermediate laye having layer thickness of from 5 to 60 μ which is soluble in washout solvents and containing 0.01 to 10 percent by weight of actinic light absorbers, said intermediate layer when exposed to light from the base side of the multilayer sheet through a negative absorbing substantially all light intensities corresponding to the tonal values zero to approximately 30 percent of the negative, and c. a photopolymerizable layer having a thickness from 20 to 250 μ, containing 0.01 to 10 percent by weight of a photoinitiator and 0.01 to 10 percent by weight of actinic light absorbers, said photopolymerizable layer having approximately the same high optical density as the intermediate layer to produce a steep gradient of light intensity within the photopolymerizable layer when exposed to actinic light, is exposed through a negative to actinic light from the base side of said multilayer sheet and the unexposed portions of the photopolymerizable layer and those positions of the intermediate layer which are directly beneath said unexposed portions are washed out with a solvent from the photopolymerizable-layer side.

2. A process as set forth in claim 1, wherein the actinic-light absorbing compound used in layer (b) and layer (c) is an aromatic dinitro or trinitro compound.

3. A process as set forth in claim 1, wherein the actinic-light-absorbing compound used in layer (b) and layer (c) is an organic-solvent-soluble metal complex dye.

4. A process as set forth in claim 1, wherein the actinic-light-absorbing compound used in layer (b) and layer (c) is a copper-containing phthalocyanine.

5. A process as set forth in claim 1, wherein the actinic-light-absorbing compound used in layer (b) and layer (c) is an o-hydroxybenzophenone or a bisphenol.

6. A process as set forth in claim 1, wherein the photopolymerizable layer (c) contains, apart from the actini-light-absorbing compound, a photocrosslinkable mixture of 10 to 50 percent by weight of monomers containing at least one photopolymerizable double bond and 50 to 90 percent by weight of solid soluble polymers, from 0.01 to 10 percent by weight, based on the photocrosslinkable mixture, of photoinitiators and from 0.01 to 2 percent by weight, based on the photocrosslinkable mixture, of polymerization inhibitors.

7. A process as set forth in claim 1, wherein the photopolymerizable layer (c) contains, apart from the actini-light-absorbing compound, a photocrosslinkable mixture of 10 to 50 percent by weight of one or more photopolymerizable acrylic acid derivatives and 50 to 90 percent by weight of a copolyamide of hexamethylene diamine adipate, 4,4'-diaminodicyclohexylmethane adipate and ε-caprolactam, from 0.5 to 5 percent by weight, based on the photocrosslinkable mixture, of a photoinitiator and from 0.1 to 2 percent by weight, based on the photocrosslinkable mixture, of a polymerization inhibitor.

8. A process as set forth in claim 1, wherein the intermediate layer (b) consists of the solid soluble polymer used in layer (c) and the actinic-light-absorbing compounds.

9. A process as set forth in claim 1, wherein the intermediate layer (b) has the same composition as the layer (c) but no photoinitiators.

10. A process as set forth in claim 1, wherein the base material which transmits actinic light is a polyester, polyvinyl chloride or cellulose acetate sheet having a thickness of from 20 to 250 μ.

* * * * *

UNITED STATES PATENT OFFICE
CERTIFICATE OF CORRECTION

Patent No. 3,787,211 Dated January 22, 1974

Inventor(s) Otto Volkert, Gerd Schrodt & Manfred Zuerger

It is certified that error appears in the above-identified patent and that said Letters Patent are hereby corrected as shown below:

First page, left-hand column, eleventh line, insert
-- [30] Foreign Application Priority Data
December 12, 1970 Germany . . . P 20 61 288.8 --.

First page, right-hand column, Abstract, fourth line, "acting" should read -- actinic --.

Column 2, line 12, "150" should read -- having --.

Column 3, line 36, "such oxygen" should read -- such as oxygen --

Column 3, line 47, "acid-(bulk of the monomers" should read -- mixture. The bulk of the monomers --.

Column 4, line 35, "(meth)" should read -- (methyl) --.

Column 6, line 36, "Exanples" should read -- Examples --.

Column 8, line 29, "N-nitrosocyclohexylhydrocylamine" should read -- N-nitrosocyclohexylhydroxylamine --.

Column 8, line 64, "N-methylolacryloamide" should read -- methylolacrylamide --.

Column 9, line 34, "photpolymerizable" should read -- photopolymerizable --

Column 9, line 34, "laye" should read -- layer --.

Column 9, line 35, "layer" should read -- a --.

Signed and sealed this 31st day of December 1974.

(SEAL)
Attest:

McCOY M. GIBSON JR.
Attesting Officer

C. MARSHALL DANN
Commissioner of Patents